US012704574B2

(12) United States Patent
Takeshima

(10) Patent No.: US 12,704,574 B2
(45) Date of Patent: Aug. 11, 2026

(54) MAGNETIC RESONANCE SIMULATION APPARATUS, MAGNETIC RESONANCE SIMULATION METHOD, AND MAGNETIC RESONANCE IMAGING APPARATUS

(71) Applicant: Canon Kabushiki Kaisha, Tokyo (JP)

(72) Inventor: Hidenori Takeshima, Taito (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 18/804,567

(22) Filed: Aug. 14, 2024

(65) Prior Publication Data

US 2025/0067825 A1 Feb. 27, 2025

(30) Foreign Application Priority Data

Aug. 23, 2023 (JP) ................................ 2023-135565

(51) Int. Cl.

*G01V 3/00* (2006.01)
*G01R 33/54* (2006.01)
*G01R 33/56* (2006.01)
*G06F 30/20* (2020.01)

(52) U.S. Cl.

CPC ....... *G01R 33/543* (2013.01); *G01R 33/5608* (2013.01); *G06F 30/20* (2020.01)

(58) Field of Classification Search

CPC .... G01R 33/543; G01R 33/5608; G06F 30/20
USPC .......................................................... 324/309
See application file for complete search history.

(56) References Cited

U.S. PATENT DOCUMENTS

2018/0144515 A1* 5/2018 Jarisch .................... G06T 12/20

OTHER PUBLICATIONS

Ahmed J. Allami, et al., “Quantum mechanical MRI simulations: Solving the matrix dimension problem”, Science Advances, vol. 5, Issue 7, Jul. 19, 2019, DOI: 10.1126/sciadv.aaw8962, https://www.science.org/doi/10.1126/sciadv.aaw8962, 23 pages.

Thies H. Jochimsen, et al., “Efficient simulation of magnetic resonance imaging with Bloch-Torrey equations using intra-voxel magnetization gradients”, Journal of Magnetic Resonance 180, 2006, 10 pages.

Hidenori Takeshima, “A fast and practical computation method for magnetic resonance simulators”, Magnetic Resonance in Medicine 90, https://doi.org/10.1002/mrm.29646, Apr. 15, 2023, 9 pages.

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A magnetic resonance (MR) simulation apparatus according to an embodiment includes processing circuitry. The processing circuitry updates and obtains, for each of voxels, an electron-spin density matrix based on a pulse sequence for acquisition of MR signals. For each of the voxels, the processing circuitry computes, during an acquisition period for the MR signals in the pulse sequence, an observation value representing a predetermined observation by using the density matrix, and computes a spatial partial differential of the observation value based on the pulse sequence. The processing circuitry computes a signal value for output based on the observation value and the spatial partial differential of the observation value. The signal value represents a sum of the MR signals in the voxels.

9 Claims, 5 Drawing Sheets

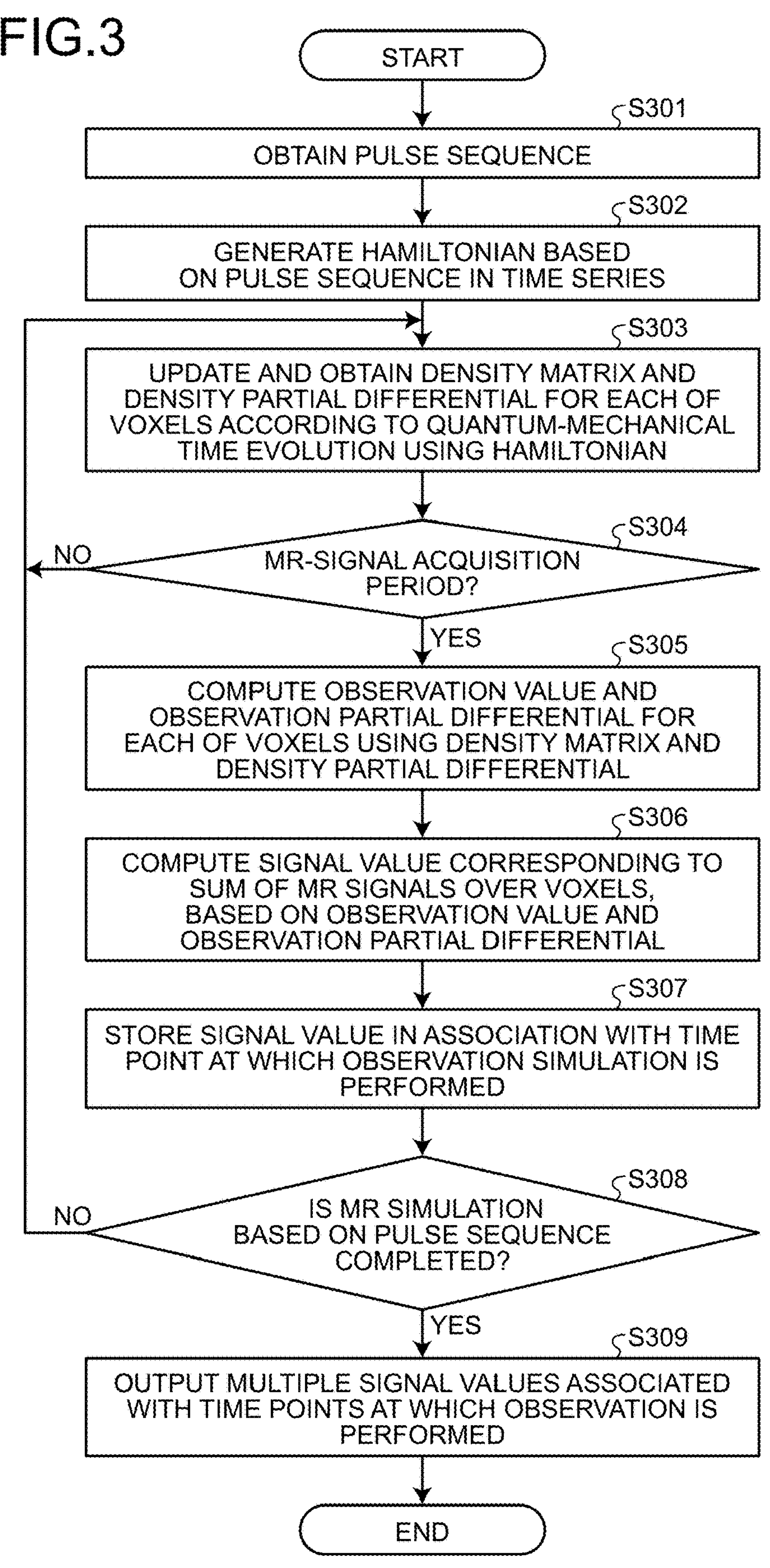
FIG.3
START
S301
OBTAIN PULSE SEQUENCE
S302
GENERATE HAMILTONIAN BASED ON PULSE SEQUENCE IN TIME SERIES
S303
UPDATE AND OBTAIN DENSITY MATRIX AND DENSITY PARTIAL DIFFERENTIAL FOR EACH OF VOXELS ACCORDING TO QUANTUM-MECHANICAL TIME EVOLUTION USING HAMILTONIAN
S304
MR-SIGNAL ACQUISITION PERIOD?
NO
YES
S305
COMPUTE OBSERVATION VALUE AND OBSERVATION PARTIAL DIFFERENTIAL FOR EACH OF VOXELS USING DENSITY MATRIX AND DENSITY PARTIAL DIFFERENTIAL
S306
COMPUTE SIGNAL VALUE CORRESPONDING TO SUM OF MR SIGNALS OVER VOXELS, BASED ON OBSERVATION VALUE AND OBSERVATION PARTIAL DIFFERENTIAL
S307
STORE SIGNAL VALUE IN ASSOCIATION WITH TIME POINT AT WHICH OBSERVATION SIMULATION IS PERFORMED
S308
IS MR SIMULATION BASED ON PULSE SEQUENCE COMPLETED?
NO
YES
S309
OUTPUT MULTIPLE SIGNAL VALUES ASSOCIATED WITH TIME POINTS AT WHICH OBSERVATION IS PERFORMED
END

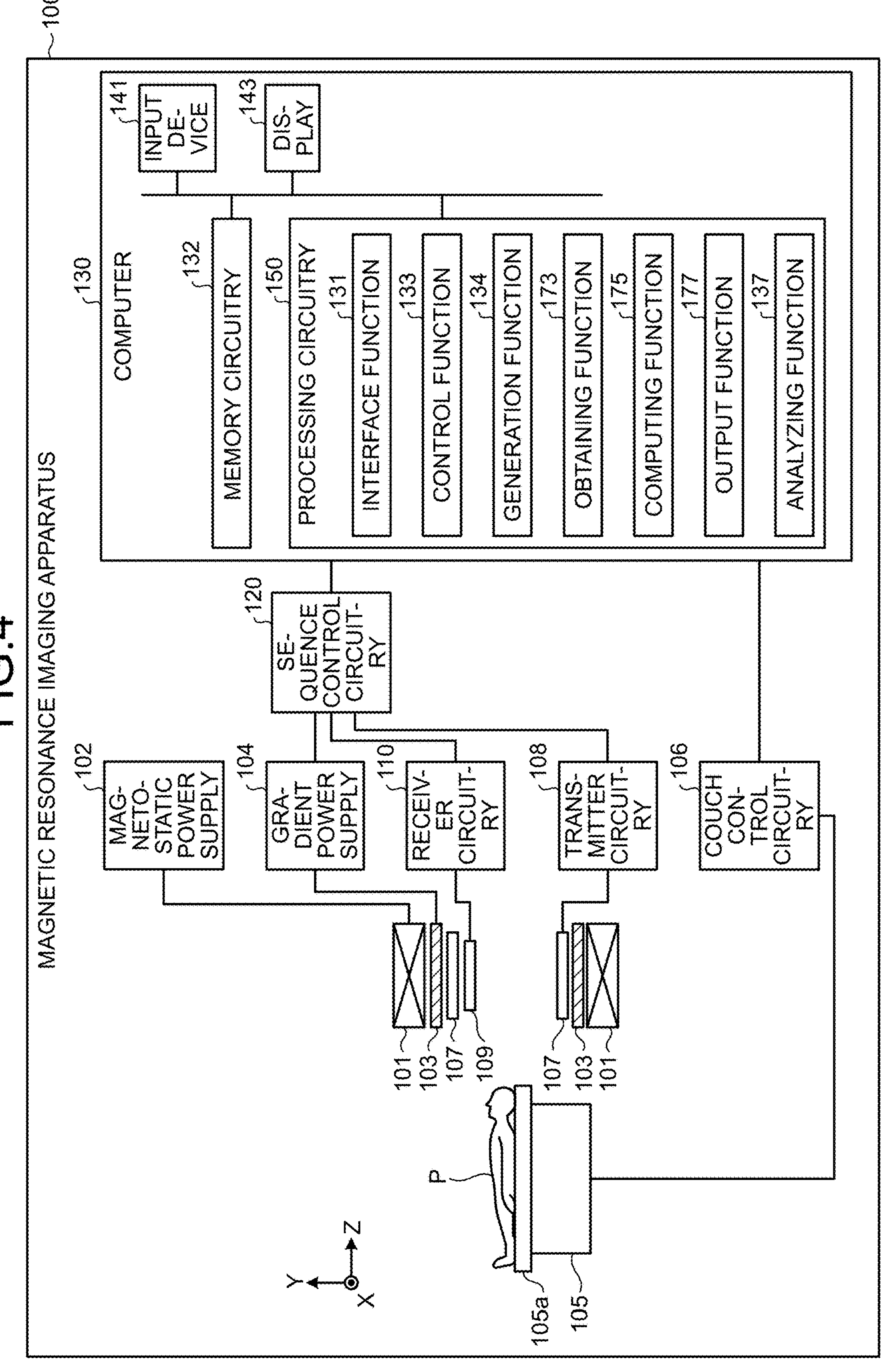
FIG.4
100
MAGNETIC RESONANCE IMAGING APPARATUS
130
COMPUTER
141
INPUT DE-VICE
143
DIS-PLAY
132
MEMORY CIRCUITRY
150
PROCESSING CIRCUITRY
131
INTERFACE FUNCTION
133
CONTROL FUNCTION
134
GENERATION FUNCTION
173
OBTAINING FUNCTION
175
COMPUTING FUNCTION
177
OUTPUT FUNCTION
137
ANALYZING FUNCTION
120
SE-QUENCE CONTROL CIRCUIT-RY
102
MAG-NETO-STATIC POWER SUPPLY
104
GRA-DIENT POWER SUPPLY
110
RECEIV-ER CIRCUIT-RY
108
TRANS-MITTER CIRCUIT-RY
106
COUCH CON-TROL CIRCUIT-RY
101
103
107
109
107
103
101
P
Z
Y
X
105a
105

MAGNETIC RESONANCE SIMULATION APPARATUS, MAGNETIC RESONANCE SIMULATION METHOD, AND MAGNETIC RESONANCE IMAGING APPARATUS

CROSS-REFERENCE TO RELATED APPLICATION

This application is based upon and claims the benefit of priority from Japanese Patent Application No. 2023-135565, filed on Aug. 23, 2023; the entire contents of which are incorporated herein by reference.

FIELD

Embodiments described herein relate generally to a magnetic resonance simulation apparatus, a magnetic resonance simulation method, and a magnetic resonance imaging apparatus.

BACKGROUND

Traditionally, simulations of a magnetic resonance phenomenon are implemented by numerically solving the Bloch equations successively with respect to magnetizations of a virtual hydrogen atom being an ensemble of hydrogen atoms contained in, for example, a single voxel in a static magnetic field. The Bloch equations, however, describe magnetic resonance in classical mechanics, therefore, they are unsuitable for simulation of, for example, a spin-spin interaction, failing to correctly represent the physics of the virtual hydrogen atom.

In order to express the physics of the virtual hydrogen atom in quantum mechanics, a magnetic resonance simulation can be performed using, for example, a density matrix of electrons in the virtual hydrogen atom. The quantum-mechanical physics of the virtual hydrogen atom may be computed with respect to, for example, a great number, as $100\times100\times100$, of isochromats arranged in a three-dimensional space, which will however require a large amount of computation time.

BRIEF DESCRIPTION OF THE DRAWINGS

FIG. 3 is a flowchart illustrating an example of an MR simulation procedure according to the first embodiment;

FIG. 4 is a schematic block diagram illustrating one example of a configuration of a magnetic resonance imaging apparatus according to a second embodiment.

DETAILED DESCRIPTION

According to an embodiment, a magnetic resonance simulation apparatus includes processing circuitry. The processing circuitry updates and obtains, for each of a plurality of voxels, a density matrix of electron spin, based on a pulse sequence for acquisition of magnetic resonance signals. During an acquisition period for the magnetic resonance signals in the pulse sequence, the processing circuitry computes, for each of the plurality of voxels, an observation value representing a predetermined observation by using the density matrix, as well as a spatial partial differential of the observation value based on the pulse sequence. The processing circuitry computes a signal value for output based on the observation value and the spatial partial differential of the observation value. The signal value represents a sum of the magnetic resonance signals in the plurality of voxels.

Figure 1:
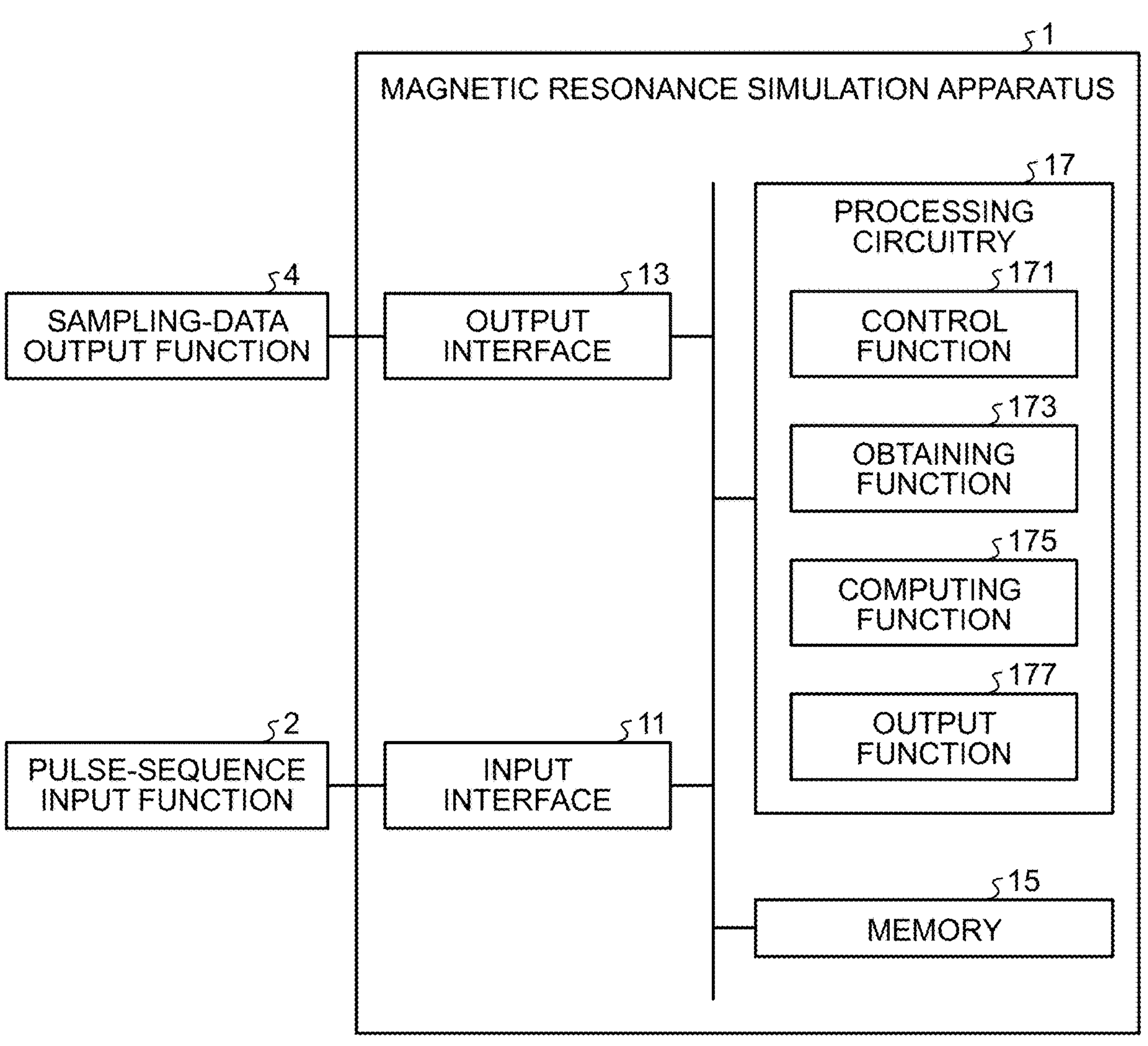
FIG. 1 is a schematic block diagram illustrating an exemplary magnetic resonance simulation apparatus according to a first embodiment.

Hereinafter, exemplary embodiments of a magnetic resonance (MR) simulation apparatus, a MR simulation method, a MR simulation program, and a magnetic resonance imaging (MRI) apparatus will be described in detail with reference to the accompanying drawings. FIG. 1 is a schematic block diagram illustrating one example of a magnetic resonance simulation apparatus 1.

First Embodiment

In the following, for the sake of specificity the magnetic resonance simulation apparatus 1 is defined to update and obtain, with respect to each of multiple voxels, an electron-spin density matrix and a spatial partial differential of the density matrix (hereinafter, referred to as a PD-DM) based on a pulse sequence for acquisition of magnetic resonance (MR) signals, to compute an output physical value corresponding to a sum of MR signals over the multiple voxels using the density matrix and the PD-DM.

In the MR simulation that numerically computes a magnetic resonance phenomenon, a virtual molecule is set in the center of each of voxels. Each voxel may correspond to an isochromat, for example. According to the present embodiment, the MR simulation is a simulation computed by quantum-mechanics-based differential equations. The MR simulation using the density matrix may be referred to as density matrix simulation.

The density matrix is, for example, defined by applying a state vector to the Schrodinger equation. The density matrix can be expressed as a basis for a density matrix in which each molecule consisting of n-spins (conceptually equivalent to atoms) is generated according to a direct product of the Pauli matrices and the identity matrix. The density matrix is, for example, a matrix denoting a quantum-theoretical physical state of a single aggregational molecule. The density matrix is used to deal with quantum-theoretical behaviors.

Density matrices describe an average behavior of a great number of molecules rather than a behavior of one molecule. Density matrices may be used to analyze nuclear magnetic resonance (NMR) and MR spectroscopy (MRS) or to generate a basis of spectrum analysis (reference waveform pattern).

Time evolution in quantum mechanics (chronological state transition) can be, for example, given as a solution of differential equations based on the Schrodinger equation. Chronological state transition is given by Hamiltonian at each time point in an MR simulation. Hamiltonians are preset by a pulse sequence for MR-image acquisition. Hamiltonians exhibit interaction particular to the quantum mechanics such as spin-spin interaction. The pulse sequence refers to information (sequence information) including definitions of imaging procedures, for example.

The pulse sequence contains, for example, definitions as to intensity and timing of current supplied from the gradient field supply to the gradient field coils in the magnetic resonance imaging (MRI) apparatus, intensity and application timing of RF pulse supplied from the transmitter circuitry to the transmission coil in the MRI apparatus, and MR-signal detection timing by the receiver circuitry in the MRI apparatus.

The MR simulation apparatus 1 includes, for example, an input interface 11, an output interface 13, a memory 15, and processing circuitry 17. The MR simulation apparatus 1 may additionally include an external storage or storages (e.g., various kinds of storage or memory) that store programs for causing the processing circuitry 17 to implement various functions and/or results of output from an output function 177.

The external storage or storages may be, for example, a driver that reads and writes various kinds of information from and to a semiconductor memory device such as a hard disk drive (HDD), a solid state drive (SSD), random access memory (RAM), or flash memory, an optical disk such as a compact disc (CD) and a digital versatile disk (DVD), or a portable storage medium, for example.

The input interface 11 is, for example, electrically connected to a pulse-sequence input function 2 of the MRI apparatus. Specifically, the input interface 11 is connected to the output terminal of the pulse-sequence input function 2 in the MRI apparatus.

In place of being connected to the MRI apparatus, the input interface 11 may be, for example, connected to an external device (e.g., sequence generator) capable of generating pulse sequence data as to MR imaging for output. Further, the connection between the input interface 11 and various kinds of devices as a source of pulse sequences may be established via a network.

The input interface 11 may include an input device that receives various kinds of instructions and information inputs from the user. Such an input interface 11 corresponds to, for example, a pointing device such as a mouse and a trackball or an input device such as a keyboard. As an example, in response to a user instruction, the input interface 11 receives a pulse sequence to be a subject of MR simulation.

The input interface 11 may allow the user to input an output instruction as to a result of an MR simulation by the MR simulation apparatus 1. The output instruction refers to an instruction for the output interface 13 to output results of an MR simulation to various kinds of external devices and/or displays, for example. The input interface 11 corresponds to an input unit.

Figure 2:
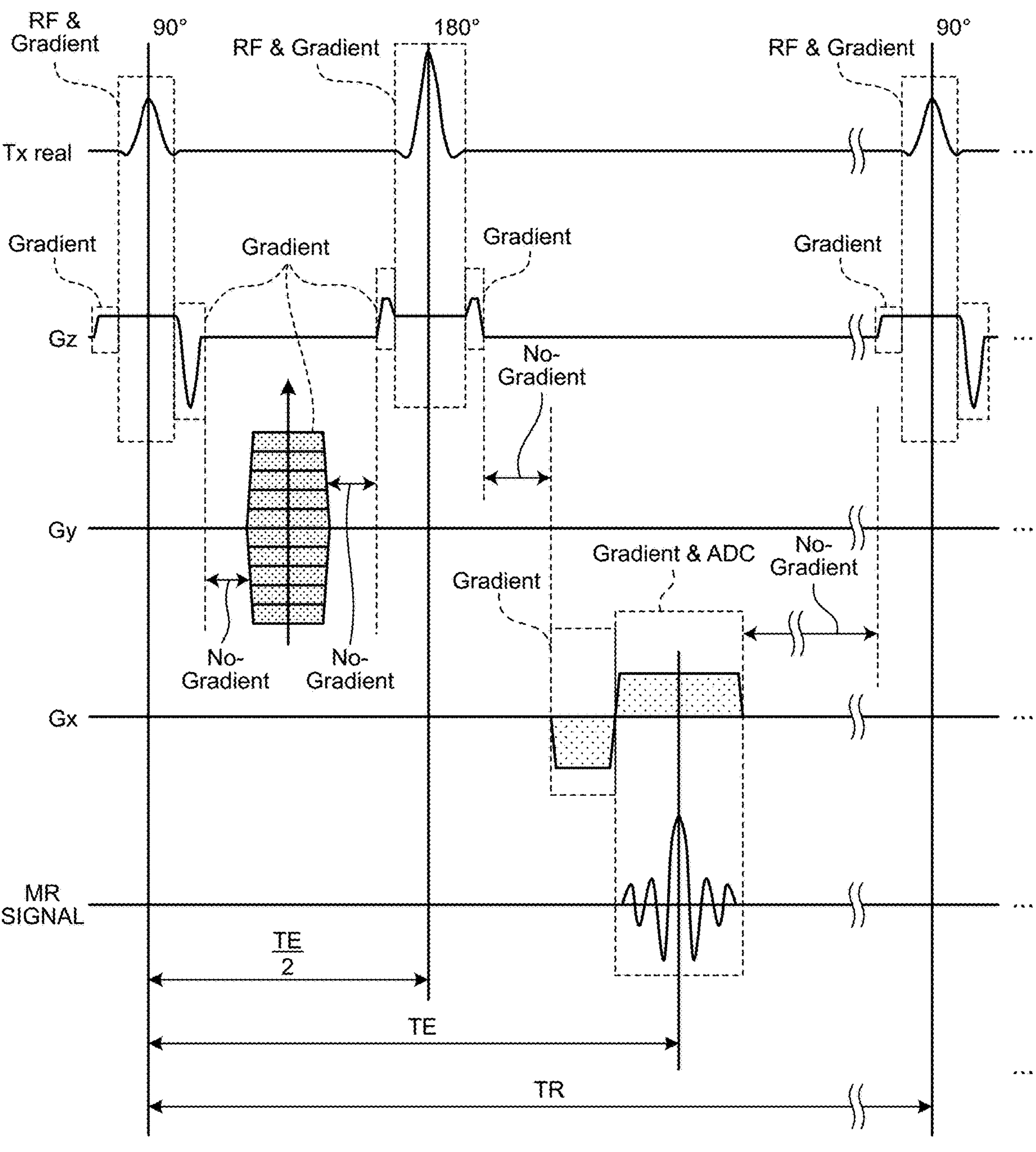
FIG. 2 illustrates a pulse sequence by a spin echo method according to an embodiment as an example.

FIG. 2 illustrates a pulse sequence according to a spin echo method as an example. In FIG. 2, Tx real represents actual transmission RF pulses. Virtual transmission RF pulses may have the same waveform as the actual transmission RF pulses or a different waveform therefrom. Gz represents a slice-selective gradient magnetic field. Gy represents a phase-encoding gradient magnetic field. Gx represents a readout gradient magnetic field. In the pulse sequence of FIG. 2, a readout gradient magnetic field is applied to acquire MR signals after an echo time (TE) passes from the application of a 90-degree RF pulse.

MR signals are converted into digital signals by an analog-to-digital converter (ADC). Although not shown in FIG. 2, any of various kinds of pulses such as preparation pulse may be suitably applied depending on a pulse sequence type.

As illustrated in FIG. 2, the pulse sequence is represented by a combination of application of a gradient magnetic field (Gradient), application of an RF pulse and a gradient magnetic field (RF & Gradient), application of a gradient magnetic field and A/D conversion (Gradient & ADC), and a duration of no application of a gradient magnetic field (No-Gradient). In the spin echo method of FIG. 2, for example, the combination of Gradient, RF & Gradient, Gradient & ADC, and No-Gradient is iterated a number of times corresponding to the number of phase encoding steps. In each phase encoding, Gradient is calculated in one step and Gradient & ADC is iteratively calculated a number of times equal to the number of ADCs (number of samplings) in FIG. 2. The number of these computations is less than that of RF & Gradient computations, for example.

The pulse-sequence input function 2 inputs, to the input interface 11, Gradient such as prepulse, RF & Gradient, Gradient such as crusher, RF & Gradient, Gradient & ADC, and No-Gradient in a time series. The input interface 11 outputs Gradient, RF & Gradient, RF & Gradient, and Gradient & ADC to the processing circuitry 17 in a time series.

The pulse sequence of the present embodiment is not limited to the pulse sequence illustrated in FIG. 2. A combination of RF & Gradient, Gradient, Gradient & ADC, and No-Gradient is iterated appropriately, in a typical pulse sequence. The input interface 11 may also be connected to, for example, the output terminal of the transmitter circuitry and the output terminal of the gradient power supply in the MRI apparatus. In this case the input interface 11 receives a voltage and a current corresponding to a gradient magnetic field strength, application timing of the gradient magnetic field, application timing of a current and an RF pulse to be supplied to the transmission coil, and MR-signal detection timing from the MRI apparatus.

The output interface 13 is, for example, connected to a sampling-data output function 4 of the sequence control circuitry in the MRI apparatus. The output interface 13 outputs signal values computed by the output function 177 to the sampling-data output function 4, under the control of a control function 171. The output interface 13 may be connected to various kinds of devices (e.g., various kinds of displays, analyzers, and image generators) that use such output values for display, analysis, or processing, in addition to the sequence control circuitry. The output interface 13 and various kinds of devices being destinations of the output values may be connected together via a network. Further, the output interface 13 may include a display that displays output values and else under the control of the control function 171. Examples of the display include a known display device such as a liquid crystal display.

The memory 15 may be, for example, a storage that stores therein various kinds of information, such as a hard disk drive (HDD), a solid state drive (SSD), or a semiconductor circuit memory device. In addition to the HDD or SSD, the memory 15 may be a driver that reads and writes various kinds of information from and to a portable storage medium such as a compact disc (CD), a digital versatile disk (DVD), or a flash memory, or a semiconductor memory device such as random access memory (RAN), for example.

The memory 15 stores, for example, a variety of computer programs for execution of the control function 171, an obtaining function 173, a computing function 175, and an output function 177. The memory 15 also stores, for example, various types of data generated by the execution of the control function 171, the obtaining function 173, the computing function 175, and the output function 177.

For example, the memory 15 stores pulse sequences input via the input interface 11. The memory 15 also stores Hamiltonians which are set by the obtaining function 173 based on a pulse sequence in a time series. Every time an update occurs, the memory 15 stores, for each of multiple voxels, updates of a density matrix and a PD-DM which are computed along with quantum-mechanical time evolution using the Hamiltonian. Further, the memory 15 stores, in association with each of the voxels, an observation value and a partial differential of an observed value (hereinafter, observation partial differential), which are calculated based on the density matrix and the PD-DM during an MR-signal acquisition period in a pulse sequence. The memory 15 also stores a signal value representing a sum of MR signals over the multiple voxels. The memory 15 further stores various algorithms for computing density matrices, PD-DMs, observation values, and observation partial differentials. The memory 15 corresponds to a storage unit.

The processing circuitry 17 controls the operation of the MR simulation apparatus 1 as a whole in accordance with electric signals of inputs outputted from the input interface 11. For example, the processing circuitry 17 includes hardware resources such as a processor as a central processing unit (CPU), a micro processing unit (MPU), or a graphics processing unit (GPU), and memory such as read only memory (ROM) and RAM. Alternatively, the processing circuitry 17 can be implemented by an application specific integrated circuit (ASIC), a field programmable gate array (FPGA), another complex programmable logic device (CPLD), or a simple programmable logic device (SPLD).

The processing circuitry 17 includes, for example, the control function 171, the obtaining function 173, the computing function 175, and the output function 177. The control function 171, the obtaining function 173, the computing function 175, and the output function 177 are individually stored in computer-executable program format in the memory 15. By using the processor that loads and executes the computer programs on the memory, the processing circuitry 17 performs the control function 171, the obtaining function 173, the computing function 175, and the output function 177.

Thus, the processing circuitry 17 corresponds to a processor that implements the functions corresponding to the programs by retrieving and executing the programs from the memory 15. In other words, having retrieved the respective programs, the processing circuitry 17 includes the functions corresponding to the programs. The control function 171, the obtaining function 173, the computing function 175, and the output function 177 may not be implemented by a single piece of processing circuitry. The processing circuitry can be constituted of a combination of multiple independent processors, so that the processors can individually execute the programs to implement the control function 171, the obtaining function 173, the computing function 175, and the output function 177. The processing circuitry 17 implementing the control function 171, the obtaining function 173, the computing function 175, and the output function 177 is one example of a control unit, an obtainer unit, a computation unit, and an output unit.

The processing circuitry 17 uses the control function 171 to control the respective functions of the processing circuitry 17. Specifically, the processing circuitry 17 retrieves and loads a control program from the memory 15 onto the internal memory, to control the respective elements of the MR simulation apparatus 1 according to the control program. The obtaining function 173, the computing function 175, and the output function 177 implemented by the processing circuitry 17 will be described later along the steps of a process of performing an MR simulation (hereinafter, an MR simulation process).

The overall configuration and structure of the MR simulation apparatus 1 have been described. Hereinafter, a procedure of an MR simulation will be explained. FIG. 3 is a flowchart illustrating one example of steps of an MR simulation process.

MR Simulation Process

Step S301

The processing circuitry 17 uses the obtaining function 173 to obtain a pulse sequence for MR imaging. Alternatively, the pulse sequence may be generated in response to a user instruction given via the input interface 11. The obtaining function 173 stores the pulse sequence in the memory 15.

Step S302

The processing circuitry 17 further uses the obtaining function 173 to set Hamiltonians based on a pulse sequence for MR-signal acquisition. With respect to the pulse sequence in FIG. 2, for example, a Hamiltonian is set in each of multiple durations, i.e., a duration of application of a gradient magnetic field (Gradient), a duration of application of an RF pulse and a gradient magnetic field (RF & Gradient), a duration of application of a gradient magnetic field and analog-to-digital (A/D) conversion (Gradient & ADC), and a duration of no application of a gradient magnetic field (No-Gradient). The obtaining function 173 stores the set Hamiltonians in the memory 15. Hamiltonian setting based on the pulse sequence is feasible by any of known methods, therefore, a description thereof is omitted. At step S303, the set Hamiltonians are used to compute an update of the quantum electron-spin state in each of multiple voxels, i.e., computation of time evolution of a spin density matrix.

Step S303

Upon start of an MR simulation, the processing circuitry 17 uses the obtaining function 173 to update and obtain, for each of the voxels, a density matrix and a PD-DM based on the pulse sequence. For example, the obtaining function 173 updates and obtains a density matrix and a PD-DM for each of the voxels according to quantum-mechanical time evolution using the set Hamiltonians. Specifically, as to the pulse sequence of FIG. 2, the obtaining function 173 updates the density matrix by multiplying the density matrix by the Hamiltonian corresponding to the pulse sequence along the time axis.

Specifically, the processing circuitry 17 allows the obtaining function 173 to use, as initial values, an optional initial matrix set, e.g., a density matrix and a PD-DM corresponding to the electron spin state in equilibrium. The obtaining function 173 computes the time evolution of the density matrix and the PD-DM from the initial density matrix and the PD-DM using the Hamiltonian. Upon each computation of the density matrix and the PD-DM, the obtaining function 173 updates the density matrix and the PD-DM for storage in the memory 15.

An example of the quantum-mechanical computation for obtaining and updating the density matrix and the PD-DM by equations using Hamiltonians will be explained later. In the computation of PD-DMs according to the present embodiment, a Hamiltonian model is, for example, such that the Hamiltonian is constant throughout each of the voxels.

Step S304

Unless the MR simulation is in the MR-signal acquisition period of the pulse sequence (No at step S304), the operation at step S303 is iterated. In this manner, density matrices and PD-DMs are computed for update. If the MR simulation is in the MR-signal acquisition period of the pulse sequence (Yes at step S304), the process proceeds to step S305.

Step S305

The processing circuitry 17 uses the computing function 175 to compute an observation value for each of the voxels using the density matrix and the PD-DM during the MR-signal acquisition period of the pulse sequence. The observation value represents a predetermined observation. The computation of the observation value is a quantum-mechanical computation and one example using equations will be presented later. Further, the computing function 175 computes, for each of the voxels, an observation partial differential based on the pulse sequence related to the MR-signal acquisition period. The observation partial differential indicates a spatial partial differential of the observation value. For example, the computing function 175 computes the spatial partial differential of the observation value from the spatial partial differential of the density matrix computed based on the pulse sequence.

According to the present embodiment, the observation partial differential is a model which is constant in each of the voxels independent of the position in the voxel. The predetermined observation corresponds to, for example, transverse magnetization. One example of the quantum mechanical computation for obtaining the observation value and the observation partial differential using equations will be presented later.

Step S306

The processing circuitry 17 uses the output function 177 to compute a signal value corresponding to a sum of MR signals over the voxels, based on the observation value and the observation partial differential. For example, the output function 177 obtains the signal value by computing the observation value and the observation partial differential by the equations disclosed in the following document: "Thies H. Jochimsen, Andreas Schäfer, Roland Bammer, Michael E. Moseley, Efficient simulation of magnetic resonance imaging with Bloch-Torrey equations using intra-voxel magnetization gradients, Journal of Magnetic Resonance 180 (2006) 29-38)". The signal-value computation by the equations disclosed in this document will be explained later by way of example.

Step S307

The processing circuitry 17 uses the output function 177 to store the resultant signal value in the memory 15 in association with the time point at which the observation simulation is performed. In this manner the signal value becomes associated with the time point at which step S305 is performed during the MR-signal acquisition period of the pulse sequence.

Step S308

Unless the MR simulation based on the pulse sequence is completed (No at step S308), the operations at step S303 and subsequent steps are iterated. Thereby, density matrices and PD-DMs are computed for update in accordance with the pulse sequence. Upon completion of the MR simulation based on the pulse sequence (Yes at step S308), the process proceeds to step S309.

Step S309

The processing circuitry 17 uses the output function 177 to output the signal value. For example, the output function 177 outputs, to the memory 15, multiple signal values associated with the time points at which the observation is performed. This allows the memory 15 to store the signal values representing a chronological variation in the MR signal during the MR-signal acquisition period. Alternatively, the output function 177 may output the signal values to the external apparatuses such as the MRI apparatus or the analyzer, and/or the display.

The outline of the procedure of the MR simulation has been explained. In the following, equations for use in the respective steps of the MR simulation process will be described by way of example. As an example, time evolution in quantum mechanics using the Hamiltonian is described by the Schrodinger equation for the sake of specificity, however, it may be described by, for example, the Heisenberg equation of motion in addition to the Schrodinger Equation (1) as below.

A time-dependent Schrodinger equation including a wave function $|\psi(t)\rangle$ is given as Equation (1) as follows:

$$\frac{\partial}{\partial t}|\psi(t)\rangle = -i\hat{H}(t)|\psi(t)\rangle \tag{1}$$

The left side of Equation (1) denotes a partial differential of time of the wave function $|\psi(t)\rangle$. In the right side of Equation (1), Hamiltonian H's operator (H-hat) and the negative imaginary act on the wave function $|\psi(t)\rangle$. The hat symbol or circumflex "^" represents an operator. Note that in the following, the hat symbol "^" placed over any symbol denotes an operator. The Hamiltonian H is generated by the obtaining function 173 based on the pulse sequence in a time series at step S302.

The spin-density operator is defined by bra-ket notation of the wave function as the following Equation (2):

$$\hat{\sigma}(t) = |\psi(t)\rangle\langle\psi(t)| \tag{2}$$

The spin-density operator is expressed in matrix, for example.

The Schrodinger equation for the spin-density operator is expressed by the following Equation (3):

$$\frac{\partial}{\partial t}\hat{\sigma}(t) = -i\left(\hat{H}(t)\hat{\sigma}(t) - \hat{\sigma}(t)\hat{H}(t)\right) \tag{3}$$

From Equation (3), an update equation (time evolution) of the spin-density operator with respect to an infinitesimal time $\Delta t$ is expressed as the following Equation (4):

$$\hat{\sigma}(t-\Delta t) = \exp\left(i\hat{H}(t)\right)\hat{\sigma}(t)\exp\left(+i\hat{H}(t)\right) \tag{4}$$

At step S303, Equation (4) is used to calculate an update of the quantum electron-spin state in each of the voxels, i.e., calculation of the time evolution of the density matrix. In Equation (4) the argument t of the Hamiltonian H may be (t+½Δt) or the Hamiltonian H may be approximated to an average of Hamiltonians from t to (t+½Δt).

When a spatial partial differential $\partial_p$ (where p is a spatial coordinate axis) acts on both sides of Equation (3), the following Equation (5) is obtained with a differential of the composite operation taken into account. In Equation (5), a partial differential arising from the spatial coordinate axis p is abridged as $\partial/\partial p \equiv \partial p$ upon premise that the spatial coordinate axis p is $p \in \{x, y, z\}$.

$$\frac{\partial}{\partial t}\partial_p\hat{\sigma}(t) = -i\left(\partial_p\left(\hat{H}(t)\hat{\sigma}(t)\right) - \partial_p\left(\hat{\sigma}(t)\hat{H}(t)\right)\right) = -i\left(\left(\partial_p\hat{H}(t)\right)\hat{\sigma}(t) - \hat{\sigma}(t)\left(\partial_p\hat{H}(t)\right)\right) - i\left(\hat{H}(t)(\partial_p\hat{\sigma}(t)) - (\partial_p\hat{\sigma}(t))\hat{H}(t)\right) \tag{5}$$

According to the present embodiment, in one exemplary model the Hamiltonian is constant throughout the voxel, i.e., the spatial partial differential of the Hamiltonian equates zero in the voxel. Thus, Equation (5) can be expressed as the following Equation (6):

$$\frac{\partial}{\partial t}\partial_p\hat{\sigma}(t) = -i\left(\hat{H}(t)(\partial_p\hat{\sigma}(t)) - (\partial_p\hat{\sigma}(t))\hat{H}(t)\right) \tag{6}$$

From Equation (6), the spatial partial differential (PD-DM) of the spin-density operator is found as an update equation with respect to the infinitesimal time Δt as represented by the following Equation (7):

$$\partial_p\hat{\sigma}(t-\Delta t) = \exp\left(-i\hat{H}(t)\right)(\partial_p\hat{\sigma}(t))\exp\left(+i\hat{H}(t)\right) \tag{7}$$

As another example, when a Hamiltonian's RF pulse is constant in the voxel and a primary gradient magnetic field is applied, the spatial partial differential of the Hamiltonian may be given as the following exemplary Equation (8):

$$\partial_p\hat{H} = -G_p\sum_k I_{k,p} \tag{8}$$

where $G_p$ represents a primary coefficient in a p-direction of the gradient magnetic field, and $I_{k,p}$ represents a $k^{th}$ spin in the p-direction.

Equation (7) is used to calculate an update of the spatial partial differential of electron spin in each of the voxels, i.e., calculation of the time evolution of the PD-DM, at step S303. In Equation (7) the argument t of the Hamiltonian H may be (t+½Δt) or the Hamiltonian H may be approximated to an average of the Hamiltonians from t to (t+½Δt).

In the duration (Gradient Gx & ADC), an X-directional gradient magnetic field (Gx) is applied to acquire magnetic resonance signals for A/D conversion. The Gradient Gx & ADC duration corresponds to a macroscopic-magnetization observing period. The observed value of an actual component $I_x$ and the observed value of a virtual component $I_y$ of the magnetization can be calculated by Equations (9) below:

$$\langle\hat{I}_x\rangle = Tr\{\hat{\sigma}\hat{I}_x\} \qquad \langle\hat{I}_y\rangle = Tr\{\hat{\sigma}\hat{I}_y\} \tag{9}$$

In Equations (9) the hat symbols above $I_x$ and $I_y$ denote a summation of the operators in the density matrix basis in x and y directions with respect to all the spins. For example, transverse magnetization $M_{xy}$ can be expressed as $M_{xy}=I_x+iI_y$ using the actual component $I_x$ and virtual component $I_y$ of the magnetization. That is, the observed value of the transverse magnetization $M_{xy}$ can be calculated by Equation (10) below. At step S305, Equation (10) is used to calculate the observation value for each of the voxels, using the density matrix and the spatial partial differential of the density matrix.

$$\langle\hat{M}_{xy}\rangle = Tr\left(\hat{\sigma}\hat{I}_x\right) + iTr\left(\hat{\sigma}\hat{I}_y\right) \tag{10}$$

The MR simulation is intended to compute macroscopic magnetization of the overall voxels having a volume. The observation partial differential, which indicates the spatial partial differential of the observation value, is a model that is constant in each of the voxels independent of the position in the voxel. In the following, computation of a typical observation A-hat will be described as an example of computation of the observation partial differential. An observation of the spatial partial differential relative to the observation A-hat can be represented by the following Equation (11):

$$\left\langle\partial_p\hat{A}\right\rangle = Tr\left\{\partial_p\left(\hat{\sigma}\hat{A}\right)\right\} \tag{11}$$

Equation (12) is obtained by applying the Leibniz rule to the spatial partial differential $\partial_p$ at a coordinate p in the right side of Equation (11), as follows:

$$\left\langle\partial_p\hat{A}\right\rangle = Tr\left\{\hat{\sigma}\left(\partial_p\hat{A}\right) + \partial_p(\hat{\sigma})\hat{A}\right\} \tag{12}$$

The observation partial differential is constant so that the initial term of the right side of Equation (12) equates zero. Thus, Equation (12) results in the following Equation (13)

$$\left\langle\partial_p\hat{A}\right\rangle = Tr\left\{\partial_p(\hat{\sigma})\hat{A}\right\} \tag{13}$$

At step S305, Equation (13) is used to calculate the observation partial differential for each of the voxels, using the density matrix and the spatial partial differential of the density matrix. For example, the processing circuitry 17 uses the computing function 175 to compute the observation partial differential (spatial partial differential of an observation value) by Equation (13), using the spatial partial differential of the density matrix calculated based on the pulse sequence.

The following will describe different equations for use at step S306 by way of example. The value represented by Equation (14) is calculated based on the observation value calculated by Equation (10) and the partial differential of the transverse magnetization (observation partial differential) calculated by Equation (13). The symbols in Equations (14) to (16) below conform to those defined in the above-referenced document, "Thies H. Jochimsen, Andreas Schafer, Roland Bammer, Michael E. Moseley, Efficient simulation of magnetic resonance imaging with Bloch-Torrey equations using intra-voxel magnetization gradients, Journal of Magnetic Resonance 180 (2006) 29-38", therefore, a description thereof is omitted when appropriate.

$$\partial_k\phi = \begin{cases} 0 & \text{if } |M_\perp| = 0, \\ \dfrac{M_x\partial_k M_y - M_y\partial_k M_x}{|M_\perp|^2} & \text{otherwise} \end{cases} \tag{14}$$

Equation (14) serves as the argument of a sinc function in Equation (15) below:

$$\mathrm{sinc}_k = \frac{\sin\left(\frac{L_k}{2}\partial_k\phi\right)}{\frac{L_k}{2}\partial_k\phi} \tag{15}$$

where $L_k$ represents a length of each axis k.

The MR signal of each of the voxels is computed by the following Equation (16) based on Equation (14) and Equation (15)

$$S_n = \mathrm{sinc}_{r1}\mathrm{sinc}_{r2}\mathrm{sinc}_{r2}|M_\perp|e^{i\phi_0}\exp\left(-\frac{|\partial_k\phi|}{T_2'}\right) \tag{16}$$

A signal value is computed at step S306 by summing up the MR signals computed by Equation (16) for all the voxels. In Equation (16), $T_2'$ denotes a difference between $T_2^*$ and $T_2$. $T_2'$ is, for example, given as a relation $1/T_2^*=1/T_2+1/T_2$.

The MR simulation apparatus 1 of the first embodiment as described above updates and obtains, for each of multiple voxels, an electron-spin density matrix and a spatial partial differential of the density matrix, based on a pulse sequence for MR-signal acquisition. During an MR-signal acquisition period in the pulse sequence, the MR simulation apparatus 1 then computes, for each of the multiple voxels, an observation value by using the density matrix and the spatial partial differential of the density matrix, and computes, for each of the multiple voxels, a spatial partial differential of the observation value based on the pulse sequence. The observation value represents a predetermined observation. The MR simulation apparatus 1 computes a signal value for output based on the observation value and the spatial partial differential of the observation value. The signal value represents a sum of the MR signals in the multiple voxels. The MR simulation apparatus 1 of the first embodiment computes the spatial partial differential of the observation value using the spatial partial differential of the density matrix computed based on the pulse sequence.

In the MR simulation apparatus 1 of the first embodiment, the spatial partial differential of the observation value is constant in each of the voxels. In the MR simulation apparatus 1 of the first embodiment, the predetermined observation corresponds to transverse magnetization. In the MR simulation apparatus 1 of the first embodiment, the Hamiltonian or the spatial partial differential of the Hamiltonian is constant.

As such, the MR simulation apparatus 1 of the first embodiment can perform MR simulation by a density matrix describing a quantum-mechanical physical process or the spatial partial differential of the density matrix, to be thereby able to track the observation of the density matrix. This makes it possible to obtain results of observation of the quantum-mechanical time evolution of transverse magnetization within a reduced computation time, for example. In this manner the MR simulation apparatus 1 of the first embodiment can obtain more accurate observational results of a quantum phenomenon such as the Zeeman effect through the MR simulation in quantum mechanics than through the MR simulation in classical mechanics. In addition, the MR simulation apparatus 1 of the first embodiment can obtain observational results in a shorter length of time than the conventional quantum-mechanical MR simulation. Further, the MR simulation apparatus 1 of the first embodiment can reduce computational errors due to discretization in the MR simulation.

Modification

This modification involves computing the observation partial differential (spatial partial differential of the observation value) without use of the density matrix and the spatial partial differential of the density matrix. For example, the processing circuitry 17 uses the computing function 175 to compute the spatial partial differential of the observation value in classical mechanics based on the pulse sequence. Specifically, the computing function 175 computes the observation partial differential by numerically solving the Bloch equations using various parameters of the pulse sequence. The Bloch equations can be numerically solved by the method described in the above-referenced document, therefore, a description thereof is omitted.

According to the modification of the first embodiment, the MR simulation apparatus 1 can compute the spatial partial differential of the observation value in a classical mechanical manner based on the pulse sequence. This allows omission of the computation of the spatial partial differential of the density matrix, to be able to reduce a length of computation time in comparison with the first embodiment even though the computation is less accurate than the computation based on the spatial partial differential of the density matrix. The rest of the effects are similar to or the same as those of the first embodiment, therefore, a description thereof is omitted.

Second Embodiment

A second embodiment involves an MRI apparatus that implements the MR simulation process performed by the respective functions of the MR simulation apparatus 1 according to the first embodiment. In the second embodiment the MRI apparatus includes various kinds of elements for performing the MR simulation process. FIG. 4 is a schematic block diagram illustrating one example of a configuration of an MRI apparatus 100 according to the second embodiment.

As illustrated in FIG. 4, the MRI apparatus 100 includes magnetostatic magnets 101, a magnetostatic power supply 102, gradient coils 103, a gradient power supply 104, a couch 105, couch control circuitry 106, transmission coils 107, transmitter circuitry 108, a reception coil 109, receiver circuitry 110, sequence control circuitry 120, and a computer (also referred to as image processing apparatus or information processing apparatus) 130. The MRI apparatus 100 does not include a subject P (such as a human body). The structure and configuration illustrated in FIG. 1 are merely exemplary. As an example, the elements of both the sequence control circuitry 120 and the computer 130 may be integrated or separated when appropriate. The computer 130 can be incorporated in a console, for example.

The magnetostatic magnets 101 are hollow, substantially cylindrical magnets to generate static magnetic fields in the internal space. Examples of the magnetostatic magnets 101 include a superconducting magnet that magnetizes, supplied with a current from the magnetostatic power supply 102. The magnetostatic power supply 102 supplies currents to the magnetostatic magnets 101. The magnetostatic magnets 101 can be permanent magnets. In this case the MRI apparatus 100 may not include the magnetostatic power supply 102 or the magnetostatic power supply 102 may be separated from the MRI apparatus 100.

The gradient coils 103 are hollow, substantially cylindrical coils and located inside the magnetostatic magnets 101. Each gradient coil 103 is a combination of three coils corresponding to mutually orthogonal X-axis, Y-axis, and Z-axis. The three coils are individually supplied with currents from the gradient power supply 104, to generate gradient magnetic fields that vary in field strength along the X, Y, and Z-axes. The gradient magnetic fields generated along the X, Y, and Z-axes by the gradient coils 103 are exemplified by a slice gradient magnetic field Gs, a phase-encoding gradient magnetic field Ge, and a readout gradient magnetic field Gr. The gradient power supply 104 supplies currents to the gradient coils 103.

The couch 105 includes a couch top 105*a* on which the subject P is to be laid. Under the control of the couch control circuitry 106, the couch top 105*a* with the subject P lying thereon is inserted into a hollow space (imaging region) of the gradient coils 103. The couch 105 is typically installed such that its longitudinal side is parallel to the axis of the magnetostatic magnet 101. The couch control circuitry 106 serves to drive the couch 105 to move the couch top 105*a* longitudinally and vertically under the control of the computer 130.

The transmission coils 107 are located inside the gradient coils 103, to generate high-frequency magnetic fields, supplied with an RF pulse from the transmitter circuitry 108. The transmitter circuitry 108 supplies RF pulses corresponding to the Larmor frequency to the transmission coils 107. The Larmor frequency is defined by a type of target atoms and a magnetic field strength.

The reception coil 109 is located inside the gradient coils 103, to receive MR signals which are issued from the subject P due to an influence of the high-frequency magnetic field. The reception coil 109 outputs the MR signals to the receiver circuitry 110 upon receipt.

The transmission coils 107 and the reception coil 109 as described above are merely exemplary. Each of the transmission coils 107 and the reception coil 109 may be one or a combination of a coil having a transmission function alone, a coil having a reception function alone, and a coil having both transmission and reception functions.

The receiver circuitry 110 serves to detect MR signals output from the reception coil 109 and generate MR data from the detected MR signals. Specifically, the receiver circuitry 110 generates MR data by converting the MR signals output from the reception coil 109 into digital signals. The receiver circuitry 110 transmits the MR data to the sequence control circuitry 120. The receiver circuitry 110 may be included in a gantry apparatus equipped with the magnetostatic magnets 101 and the gradient coils 103.

The sequence control circuitry 120 performs imaging of the subject P by driving the gradient power supply 104, the transmitter circuitry 108, and the receiver circuitry 110 based on sequence information transmitted from the computer 130. Herein, the sequence information is defined as a pulse sequence related to the subject P for obtaining MR spectroscopy of the subject P for the sake of specificity. The pulse sequence is generated in advance or generated in response to a user instruction given via an input device 141, and stored in memory circuitry 132.

The pulse sequence for obtaining MR spectroscopy can be a known pulse sequence, therefore, a description thereof is omitted. For example, the sequence control circuitry 120 performs a pulse sequence for generation of MR spectroscopy to acquire MR data of the subject P. The sequence control circuitry 120 stores the MR data in the memory circuitry 132.

The sequence control circuitry 120 receives the MR data from the receiver circuitry 110 as a result of driving the gradient power supply 104, the transmitter circuitry 108, and the receiver circuitry 110 to image the subject P. The sequence control circuitry 120 transfers the MR data to the computer 130. Examples of the sequence control circuitry 120 include integrated circuitry such as an application specific integrated circuit (ASIC) and a field programmable gate array (FPGA), and electronic circuitry such as a CPU and an MPU. The sequence control circuitry 120 corresponds to a sequence control unit.

The computer 130 performs control of the MRI apparatus 100 as a whole and generates images, for example. The computer 130 includes the memory circuitry 132, the input device 141, a display 143, and processing circuitry 150. The processing circuitry 150 includes an interface function 131, a control function 133, a generation function 134, an obtaining function 173, a computing function 175, an output function 177, and an analyzing function 137.

Processing and functions to be performed by the interface function 131, the control function 133, the generation function 134, the obtaining function 173, the computing function 175, the output function 177, and the analyzing function 137 are stored in the memory circuitry 132 in the form of a program executable by the computer 130. The processing circuitry 150 is a processor that retrieves and executes the computer programs from the memory circuitry 132 to implement the functions corresponding to the respective computer programs. In other words, having retrieved the computer programs, the processing circuitry 150 includes the respective functions shown inside the processing circuitry 150 of FIG. 4.

FIG. 4 depicts an example that the single piece of processing circuitry 150 implements the processing and functions of the interface function 131, the control function 133, the generation function 134, the obtaining function 173, the computing function 175, the output function 177, and the analyzing function 137. Alternatively, the processing circuitry 150 may be constituted of a combination of independent processors so that the processors can individually implement the functions by executing the computer programs. In other words, the above functions may be configured as individual computer programs to be executed by the single piece of processing circuitry 150, or particular function or functions may be incorporated in dedicated, independent program-executable circuitry.

The term "processor" used herein signifies, for example, circuitry such as a CPU, a GPU, an application specific integrated circuit, or a programmable logic device (e.g., simple programmable logic device (SPLD), a complex programmable logic device (CPLD), and a field programmable gate array (FPGA)). The processor retrieves and executes the computer programs from the memory circuitry 132 to implement the functions.

In place of being stored in the memory circuitry 132, the computer programs may be directly embedded in the circuitry of the processor. In such a case the processor retrieves and executes the computer programs from the circuitry to implement the functions. Likewise, the couch control circuitry 106, the transmitter circuitry 108, the receiver circuitry 110, and the sequence control circuitry 120 each include electronic circuitry such as the above processor.

The memory circuitry 132 stores therein MR data as received by the interface function 131 of the processing circuitry 150, various kinds of data obtained by the obtaining function 173, various kinds of image data generated by the generation function 134, programs for use in computation by the computing function 175, results of the computation by the computing function 175, output programs for use by the output function 177, and analysis programs for use by the analyzing function 137, for example.

As an example, the memory circuitry 132 further stores density matrices and PD-DMs obtained by the obtaining function 173. The memory circuitry 132 stores observation values and observation partial differentials computed by the computing function 175. The memory circuitry 132 stores signal values computed by the output function 177. The memory circuitry 132 stores results of analysis performed by the analyzing function 137.

Moreover, the memory circuitry 132 stores MR data arranged in a k-space (also referred to as k-space data) by the control function 133. The memory circuitry 132 can be implemented by, for example, a semiconductor memory device such as a random access memory (RAN) or a flash memory, a hard disc, or an optical disc. The memory circuitry 132 may be referred to as a memory.

The input device 141 serves to receive various kinds of instructions and information inputs from the user. Examples of the input device 141 include a trackball, a switch button, a mouse, a keyboard, a touchpad that allows input by touch on the operation surface, a touch screen as an integration of a display screen and a touchpad, non-contact input circuitry including an optical sensor, and audio input circuitry. The input device 141 is electrically connected to the processing circuitry 150 to convert user inputs into electrical signals and outputs them to the processing circuitry 150.

In this disclosure, the input device 141 is not limited to the one including physical operational component or components (input interface) as a mouse and a keyboard. Other examples of the input device 141 include electrical-signal processing circuitry that receives an electrical signal corresponding to an input from an external input device separated from the MRI apparatus 100 to output the electrical signal to the control circuitry. The input device 141 corresponds to an input unit and may be referred to as an input interface or an operation unit.

Under the control of the control function 133 of the processing circuitry 150, the display 143 displays a graphical user interface that allows the user to input an imaging condition and else, and displays images generated by the generation function 134 of the processing circuitry 150. Also, the display 143 displays results of analysis performed by the analyzing function 137 as described later. Examples of the display 143 include a cathode ray tube (CRT) display, a liquid crystal display (LCD), an organic electroluminescence display (OELD), a light-emitting diode (LED) display, a plasma display, any of other displays known in related art, and a display device as a monitor. The display 143 corresponds to a display unit.

The processing circuitry 150 uses the interface function 131 to transmit the sequence information to the sequence control circuitry 120 and receive MR data from the sequence control circuitry 120. Further, the processing circuitry 150 uses the interface function 131 to store the MR data in the memory circuitry 132 upon receipt. The processing circuitry 150 implementing the interface function 131 corresponds to an interface unit.

The processing circuitry 150 uses the control function 133 to control the MRI apparatus 100 as a whole and control image generation and image display. For example, the processing circuitry 150 uses the control function 133 to receive an input of an imaging condition (imaging parameters, etc.) via the GUI and to generate sequence information according to a saturation pulse condition set by the received imaging condition. The processing circuitry 150 uses the control function 133 to transmit the generated sequence information to the sequence control circuitry 120. The processing circuitry 150 implementing the control function 133 corresponds to a control unit.

The processing circuitry 150 uses the generation function 134 to generate images by retrieving k-space data from the memory circuitry 132 and subjecting the k-space data to reconstruction processing such as Fourier transformation. For example, the generation function 134 generates MR spectroscopy of the subject P based on MR data. The generation function 134 stores the resultant MR spectroscopy in the memory circuitry 132. The MR spectroscopy can be generated by any known method when appropriate, therefore, a description thereof is omitted. The processing circuitry 150 implementing the generation function 134 corresponds to a generator unit.

The processing circuitry 150 uses the obtaining function 173 to obtain a pulse sequence to be performed by the sequence control circuitry 120 from the memory circuitry 132. For each of the voxels, the obtaining function 173 updates and obtains an electron-spin density matrix and a spatial partial differential of the density matrix (PD-DM) based on the pulse sequence. The updating and obtaining process relative to the density matrix and the PD-DM is similar to or the same as that in the first embodiment, except for use of the pulse sequence to be performed by the sequence control circuitry 120, therefore, a description thereof is omitted.

The processing circuitry 150 uses the computing function 175 to compute, for each of the voxels, an observation value using the density matrix and the spatial partial differential of the density matrix during an MR-signal acquisition period in the pulse sequence performed by the sequence control circuitry 120. The observation value represents a predetermined observation. The computing function 175 also computes a spatial partial differential of the observation value based on the pulse sequence performed by the sequence control circuitry 120. The computation process relative to the observation value and the observation partial differential is similar to or the same as that in the first embodiment, except for use of the pulse sequence performed by the sequence control circuitry 120, therefore, a description thereof is omitted.

The processing circuitry 150 uses the output function 177 to compute a signal value, which corresponds to a sum of the MR signals over the multiple voxels, based on the observation value and the spatial partial differential of the observation value computed by the computing function 175. The output function 177 outputs the resultant signal value to, for example, the memory circuitry 132. The signal-value computation and output process is similar to or the same as that in the first embodiment, therefore, a description thereof is omitted.

The processing circuitry 150 uses the analyzing function 137 to generate and output an analysis result representing molecule information as to the subject P by applying the MR spectroscopy generated by the generation function 134 to the signal value. Specifically, the analyzing function 137 fits the MR spectroscopy of the subject P by MR imaging to the signal value computed according to the pulse sequence used in MR imaging. In this manner the analyzing function 137 outputs an analysis result indicating molecule information on the subject P. The processing circuitry 150 implementing the analyzing function 137 corresponds to an analyzer unit.

The analysis result corresponds to, for example, percentage representation of error in molecules associated with a degree of match between the MR spectroscopy and the signal value. The analyzing process performed by the analyzing function 137 can be implemented by any of various kinds of existent software, applications, or models, therefore, a description thereof is omitted. Software, applications, or models for implementing the analyzing process are prestored in the memory circuitry 132.

Figure 5:
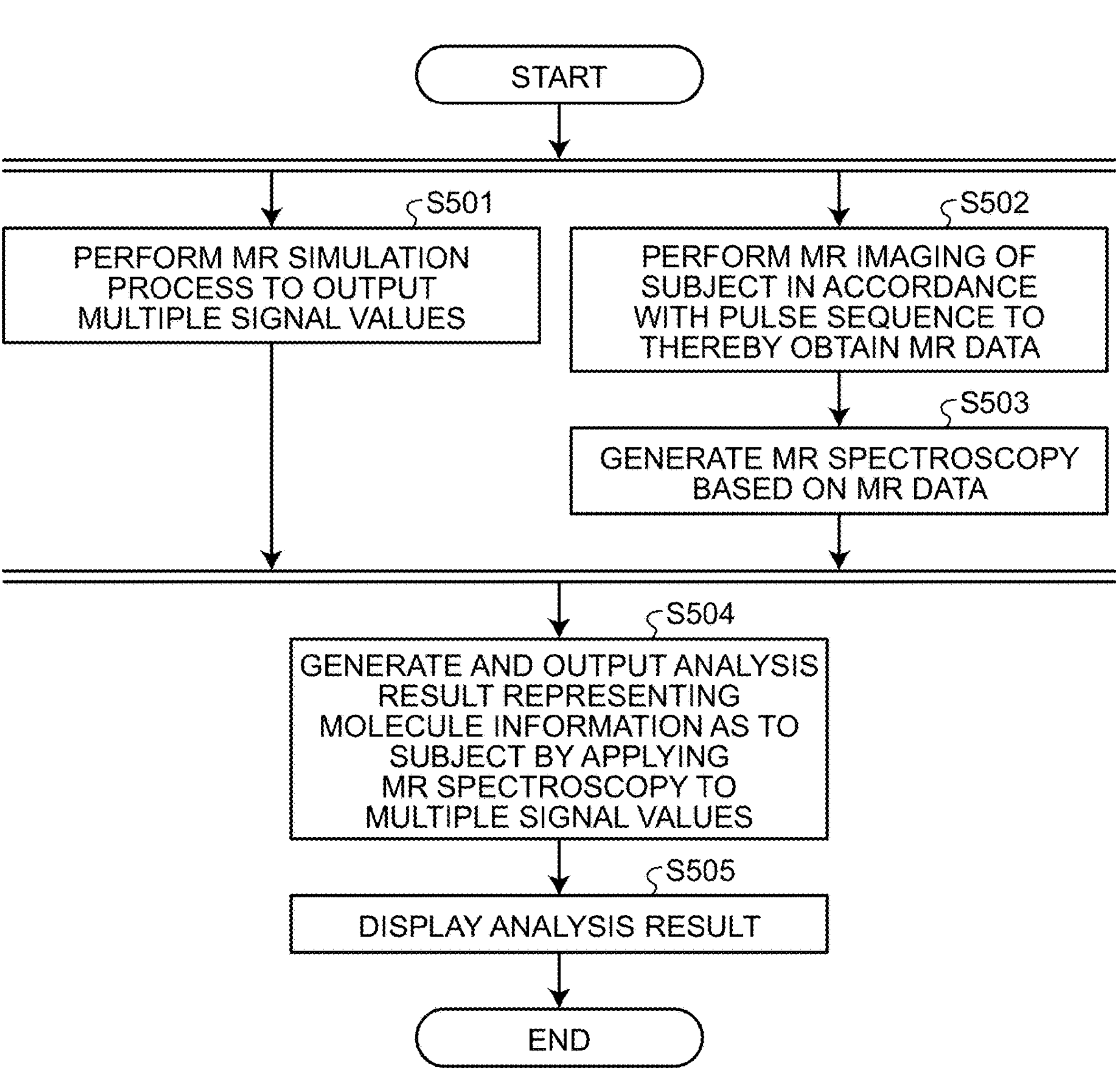
FIG. 5 is a flowchart illustrating an example of an MR simulation analysis process according to the second embodiment.

The MR simulation process and the analyzing process (hereinafter, MR-simulation analyzing process) performed by the MRI apparatus 100 configured above in the present embodiment will now be described. FIG. 5 is a flowchart illustrating steps of the MR-simulation analyzing process by way of example. Prior to the MR-simulation analyzing process, a pulse sequence for MR imaging of the subject P is defined to be preset in accordance with a user instruction given via the input device 141 or by a separate sequence generator, for example.

MR-Simulation Analyzing Process

Step S501

The processing circuitry 150 uses the obtaining function 173 to obtain a pulse sequence for MR imaging of the subject P. The processing circuitry 150 then performs an MR simulation process to output multiple signal values. The MR simulation process and the signal-value output are similar to or the same as the MR simulation process of the first embodiment illustrated in FIG. 3, therefore, a description thereof is omitted.

Step S502

The sequence control circuitry 120 performs MR imaging of the subject P in accordance with the pulse sequence. By MR imaging, the sequence control circuitry 120 obtains MR data. The sequence control circuitry 120 stores the MR data in the memory circuitry 132.

Step S503

The processing circuitry 150 uses the generation function 134 to generate MR spectroscopy of the subject P based on the MR data. The generation function 134 stores the resultant MR spectroscopy in the memory circuitry 132. As illustrated in FIG. 5, the operation at step S501 and the operations at steps S502 and S503 are performed in parallel temporally.

Step S504

The processing circuitry 150 uses the analyzing function 137 to generate and output an analysis result representing molecule information as to the subject P by applying the MR spectroscopy to the multiple signal values. Thereby, the analyzing function 137 identifies the molecule information and error in the MR spectroscopy.

Step S505

The display 143 displays the analysis result. The display 143 may display the MR spectroscopy and the multiple signal values in addition to the analysis result. For example, the display 143 may display the MR spectroscopy and the signal values in such a manner that the signal values are superimposed on the MR spectroscopy, together with the analysis result.

According to the second embodiment as described above, the MRI apparatus 100 performs a pulse sequence for generation of MR spectroscopy to acquire MR data of the subject P, and generates MR spectroscopy of the subject P based on the MR data. The MRI apparatus 100 updates and obtains, for each of multiple voxels, an electron-spin density matrix and a spatial partial differential of the density matrix, based on a pulse sequence for MR-signal acquisition. The MRI apparatus 100 then computes, for each of the multiple voxels, during an MR-signal acquisition period in the pulse sequence, an observation value representing a predetermined observation by using the density matrix and the spatial partial differential of the density matrix as well as a spatial partial differential of the observation value based on the pulse sequence, and computes a signal value for output based on the observation value and the spatial partial differential of the observation value. The signal value represents a sum of the MR signals in the multiple voxels. The MRI apparatus 100 then generates and outputs an analysis result representing molecule information as to the subject P, by applying the MR spectroscopy to the signal value, and displays the analysis result.

As such, the MRI apparatus 100 of the second embodiment can perform an MR simulation using parameters of a pulse sequence for generation of MR spectroscopy while performing the pulse sequence. Thus, the MRI apparatus 100 of the second embodiment can fit the MR spectroscopy to the output signal value after MR imaging of the subject P, to be able to present, to the user, a result of matching between the MR spectroscopy generated from MR imaging of the subject P and the signal value resulting from a quantum-mechanical computation.

Consequently, the MRI apparatus 100 of the second embodiment can present accurate analysis results of the MR spectroscopy of the subject P in a shorter period of time, leading to improving the throughput of examination and diagnosis of the subject P. The rest of the effects is similar to or the same as those of the first embodiment, therefore, a description thereof is omitted.

To implement the technical ideas of one embodiment by a magnetic resonance simulation method, the magnetic resonance simulation method includes updating and obtaining, for each of multiple voxels, an electron-spin density matrix and a spatial partial differential of the density matrix, based on a pulse sequence for MR-signal acquisition; computing, for each of the multiple voxels, during an MR-signal acquisition period in the pulse sequence, an observation value representing a predetermined observation by using the density matrix and the spatial partial differential of the density matrix; computing, for each of the multiple voxels, during the MR acquisition period in the pulse sequence, a spatial partial differential of the observation value based on the pulse sequence; and computing a signal value for output based on the observation value and the spatial partial differential of the observation value, the signal value representing a sum of the MR signals in the multiple voxels. The procedure and effects of the MR simulation process are similar to or the same as those in the first embodiment, therefore, a description thereof is omitted.

To implement the technical ideas of one embodiment by a magnetic resonance simulation program, the magnetic resonance simulation program causes the computer to execute updating and obtaining, for each of multiple voxels, an electron-spin density matrix and a spatial partial differential of the density matrix, based on a pulse sequence for MR-signal acquisition; computing, for each of the multiple voxels, during an MR-signal acquisition period in the pulse sequence, an observation value representing a predetermined observation by using the density matrix and the spatial partial differential of the density matrix; computing, for each of the multiple voxels, during the MR acquisition period in the pulse sequence, a spatial partial differential of the observation value based on the pulse sequence; and computing a signal value for output based on the observation value and the spatial partial differential of the observation value, the signal value representing a sum of the MR signals in the multiple voxels.

As an example, the magnetic resonance simulation program may be installed in a computer included in the MRI apparatus or any of various kinds of simulation servers, and loaded on the memory to implement the MR simulation process. In this case the program for causing the computer to execute the MR simulation process can be stored and distributed in a storage medium such as a magnetic disk (e.g., hard disk), an optical disk (e.g., CD-ROM, DVD), or a semiconductor memory. In addition to using such a storage medium for distribution, the MR simulation program may be distributed by way of an electronic communication function, e.g., downloading via the Internet. The procedure and effects of the MR simulation process by the MR simulation program are similar to or the same as those in the first embodiment, therefore, a description thereof is omitted herein.

According to at least one of the embodiments and modifications described above, it is possible to decrease a length of computation time for quantum-mechanical magnetic resonance simulation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance simulation apparatus comprising processing circuitry configured to:

update and obtain, for each of a plurality of voxels, a density matrix of electron spin, based on a pulse sequence for acquisition of magnetic resonance signals;

compute, for each of the plurality of voxels, during an acquisition period for the magnetic resonance signals in the pulse sequence, an observation value by using the density matrix, the observation value representing a predetermined observation, and a spatial partial differential of the observation value based on the pulse sequence; and compute a signal value for output based on the observation value and the spatial partial differential of the observation value, the signal value representing a sum of the magnetic resonance signals in the plurality of voxels.

2. A magnetic resonance simulation method comprising:

updating and obtaining, for each of a plurality of voxels, a density matrix of electron spin, based on a pulse sequence for acquisition of magnetic resonance signals;

computing, for each of the plurality of voxels, during an acquisition period for the magnetic resonance signals in the pulse sequence, an observation value by using the density matrix, the observation value representing a predetermined observation;

computing, for each of the plurality of voxels, during the acquisition period for the magnetic resonance signals in the pulse sequence, a spatial partial differential of the observation value based on the pulse sequence; and computing a signal value for output based on the observation value and the spatial partial differential of the observation value, the signal value representing a sum of the magnetic resonance signals in the plurality of voxels.

3. A magnetic resonance imaging apparatus comprising:

sequence control circuitry configured to perform a pulse sequence for generation of magnetic resonance spectroscopy to acquire magnetic resonance data of a subject;

processing circuitry configured to:

generate magnetic resonance spectroscopy of the subject based on the magnetic resonance data, update and obtain, for each of a plurality of voxels, a density matrix of electron spin, based on the pulse sequence, compute, for each of the plurality of voxels, during an acquisition period for magnetic resonance signals in the pulse sequence, an observation value by using the density matrix, the observation value representing a predetermined observation, and a spatial partial differential of the observation value based on the pulse sequence, compute a signal value for output based on the observation value and the spatial partial differential of the observation value, the signal value representing a sum of the magnetic resonance signals in the plurality of voxels, and generate an analysis result for output by applying the magnetic resonance spectroscopy to the signal value, the analysis result representing molecule information as to the subject; and a display that displays the analysis result.

4. The magnetic resonance simulation apparatus according to claim 1, wherein the spatial partial differential of the observation value is constant in each of the plurality of voxels.

5. The magnetic resonance simulation apparatus according to claim 1, wherein the predetermined observation corresponds to transverse magnetization.

6. The magnetic resonance simulation apparatus according to claim 1, wherein a Hamiltonian based on the pulse sequence is constant in each of the plurality of voxels.

7. The magnetic resonance simulation apparatus according to claim 1, wherein the processing circuitry configured to:

update and obtain a spatial partial differential of the density matrix, for each of the plurality of voxels, based on the pulse sequence, and compute the observation value by using the density matrix and the spatial partial differential of the density matrix.

8. The magnetic resonance simulation apparatus according to claim 1, wherein the processing circuitry is configured to compute the spatial partial differential of the observation value by classical-mechanical computation based on the pulse sequence.

9. The magnetic resonance simulation apparatus according to claim 7, wherein the processing circuitry is configured to compute the spatial partial differential of the observation value by using the spatial partial differential of the density matrix computed based on the pulse sequence.

* * * * *